United States Patent [19]

Wunsch et al.

[11] 4,454,596
[45] Jun. 12, 1984

[54] FREE-PROGRAMMABLE, MODULAR CONTROL SYSTEM WITH INTEGRATED USER DEFINABLE DISPLAY AND OPERATING DEVICES

[76] Inventors: Reinhold Wunsch, Friedrich-Ebert Str. 62, D-4150 Krefeld; Albrecht Lezius, Corneliusplatz 65, D-4154 Tönisvorst 1, both of Fed. Rep. of Germany

[21] Appl. No.: 339,043

[22] Filed: Jan. 13, 1982

Related U.S. Application Data

[63] Continuation of Ser. No. 81,793, Oct. 4, 1979, abandoned.

[30] Foreign Application Priority Data

Oct. 12, 1978 [DE] Fed. Rep. of Germany ....... 2844388
Apr. 18, 1979 [DE] Fed. Rep. of Germany ....... 2915528

[51] Int. Cl.³ .................... G06F 15/46; G06F 15/02; G06F 9/06
[52] U.S. Cl. .................... 364/900; 307/112; 340/718; 340/815.13; 339/18 R; 361/346
[58] Field of Search ... 364/200 MS File, 900 MS File; 340/815.12, 815.13, 815.14, 718, 712, 365 R; 339/18 R, 17 R; 361/330, 331, 346; 307/112, 113, 115, 39

[56] References Cited

U.S. PATENT DOCUMENTS

| | | | |
|---|---|---|---|
| 3,582,927 | 6/1971 | Primavera | 340/815.14 |
| 3,737,898 | 6/1973 | Cross, Jr. | 340/815.13 |
| 3,828,317 | 8/1974 | Mette | 364/900 X |
| 3,868,648 | 2/1975 | Levin | 364/147 X |
| 4,064,395 | 12/1977 | Schubeler et al. | 364/900 X |
| 4,074,350 | 2/1978 | Roch et al. | 364/188 X |
| 4,104,731 | 8/1978 | Grudowski et al. | 364/900 |
| 4,107,784 | 8/1978 | Van Bemmelen | 364/900 |
| 4,125,782 | 11/1978 | Pollnow, Jr. | 364/900 X |
| 4,131,777 | 12/1978 | Bailey et al. | 340/815.13 |
| 4,149,235 | 4/1979 | Froyd et al. | 364/900 X |
| 4,171,541 | 10/1979 | Houpt | 364/900 |
| 4,222,039 | 9/1980 | Cronin | 340/815.12 |
| 4,229,732 | 10/1980 | Hartstein et al. | 340/815.12 |
| 4,254,473 | 3/1981 | Galdun et al. | 364/900 |

*Primary Examiner*—Jerry Smith
*Assistant Examiner*—William G. Niessen

[57] ABSTRACT

A display and control element is described which comprises several lighted push buttons which are—if necessary—mutually resetable and are mounted on a board insertable into a casing. The operating of the individual lighted push buttons as well as the optional mutual resetability is electrically determined by means of circuits. The arrangement and setting of such circuits is adjustable without change of the wiring by means of code switches, crossbar distributors, plug-in connectors, etc. or by means of the program (software) of a microprocessor which preferably is mounted on a separate plug-in board. For more complicated plants to be controlled several such elements may be combined in a casing and, if necessary, also several such casings may be connected to each other by means of data lines. In such a case it is advisable to locate the microprocessor in a central casing, so that such a microprocessor can centrally control all the display and control elements with respect to their operation and their mutual resetability. In view of the versatility of the display and control element according to the invention such element may replace the several display and control elements of different construction being necessary according to the prior art for the control of for example air conditioning plants, thereby saving costs with respect to construction as well as maintenance.

12 Claims, 16 Drawing Figures

FIG. 7

| INPUT/OUTPUT BOARD TERMINAL NO. 1. | | LEGEND | APPARATUS TERMINAL NO. | INDEX |
|---|---|---|---|---|
| E1 | | SWITCH CLOCK | a | d3 |
| E2 | | FREEZING PROTECTION THERMOSTAT | 2 | e1 |
| E3 | | EXCESSIVE CURRENT TRIP SUPPLY AIR | g5 | e2 |
| E4 | | EXCESSIVE CURRENT TRIP EXHAUST AIR | g5 | e3 |
| E5 | | PRESSURE SWITCH SUPPLY AIR | 4 | e4 |
| E6 | | PRESSURE SWITCH EXHAUST AIR | 6 | e5 |
| E7 | | FEED BACK SIGNAL SUPPLY AIR | 14 | c1 |
| E8 | | FEED BACK SIGNAL EXHAUST AIR | 14 | c2 |
| E9 | | FEED BACK SIGNAL CONTROL | 14 | d7 |
| 10 | | | | |
| A1 | ⟋ | SUPPLY AIR FAN SWITCH | PHASE | |
| 11 | | | a | c1 |
| 20 | | | | |
| A2 | ⟋ | EXHAUST AIR FAN SWITCH | PHASE | |
| 21 | | | a | c2 |
| 30 | | CLOSED | 8 | |
| A3 | ⟋ | FLAP POSITION MOTOR | PHASE | |
| 31 | | OPEN | 7 | |
| 40 | | | | |
| A4 | ⟋ | CONTROL ENABLE | PHASE | |
| 41 | | | a | d7 |

FIG. 9.

BEGIN AT STORAGE LOCATION 0001
| STR | E | B | LD | STEP | AND | NOT | I | E | 2 | LD | STEP | SET | A | 1 | LD | STEP |

BEGIN AT STORAGE LOCATION 0004
| STR | E | 2 | LD | STEP | AND | I | E | 1 | LD | STEP | OR | E | 3 | LD | STEP | AND | I |
| E | 2 | LD | STEP | AND | I | E | 3 | LD | STEP | SET | I | A | 1 | LD | STEP |

BEGIN AT STORAGE LOCATION 0010
| STR | E | 2 | LD | STEP | SET | A | 2 | LD | STEP |

BEGIN AT STORAGE LOCATION 0012
| STR | I | E | 7 | LD | STEP | STR | E | B | LD | STEP | AND | NOT | I | E | 3 | LD | STEP |
| OR | STR | LD | STEP | SET | A | 3 | LD | STEP |

BEGIN AT STORAGE LOCATION 0017
| STR | I | E | 7 | LD | STEP | SET | I | A | 3 | LD | STEP | SET | I | A | 4 | LD | STEP |

BEGIN AT STORAGE LOCATION 0020
| STR | I | E | 9 | LD | STEP | SET | A | 6 | LD | STEP |

BEGIN AT STORAGE LOCATION 0022
| STR | E | 4 | LD | STEP | AND | I | E | 7 | LD | STEP | STR | E | 5 | LD | STEP | OR | STR |
| LD | STEP | AND | I | E | 4 | LD | STEP | SET | I | A | 2 | LD | STEP |

BEGIN AT STORAGE LOCATION 0028
| STR | E | 4 | LD | STEP | SET | A | 4 | LD | STEP |

BEGIN AT STORAGE LOCATION 0030
| STR | I | E | 8 | LD | STEP | STR | E | B | LD | STEP | AND | NOT | I | E | 4 | LD | STEP |
| OR | STR | LD | STEP | SET | A | 5 | LD | STEP |

BEGIN AT STORAGE LOCATION 0035
| STR | I | E | 7 | LD | STEP | AND | NOT | I | E | 5 | LD | STEP | TIME | 20 | LD | STEP | OR |
| NOT | E | 7 | NS | LD | STEP | SET | HS | I | LD | STEP |

BEGIN AT STORAGE LOCATION 0040
| STR | E | 8 | LD | STEP | AND | HS | I | LD | STEP | SET | A | 7 | LD | STEP |

BEGIN AT STORAGE LOCATION 0043
| STR | I | E | 8 | LD | STEP | AND | NOT | I | E | 6 | LD | STEP | TIME | 20 | LD | STEP | OR |
| NOT | E | 8 | NS | LD | STEP | SET | HS | 2 | LD | STEP |

BEGIN AT STORAGE LOCATION 0048
| STR | E | 8 | LD | STEP | AND | HS | 2 | LD | STEP | SET | A | 8 | LD |

FIG. 10.

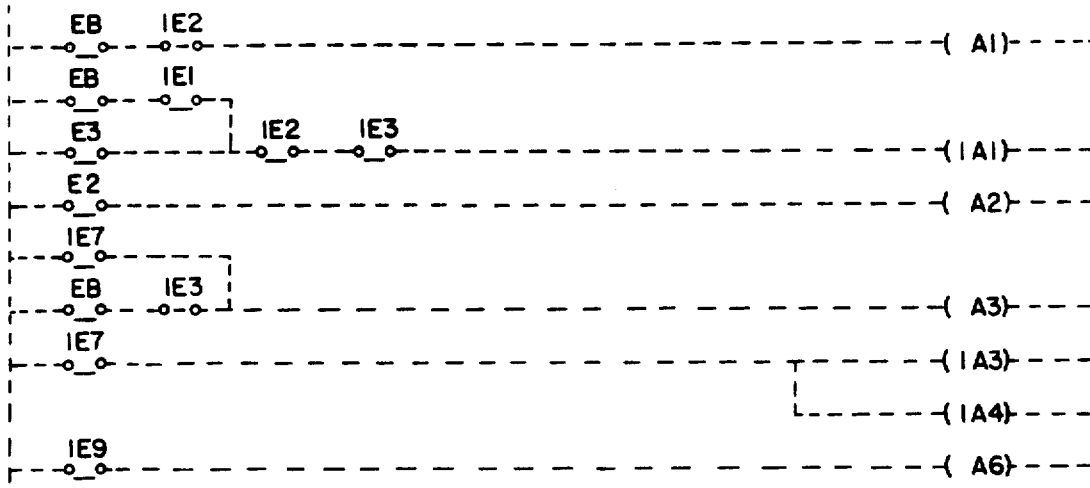

| | |
|---|---|
| 0001 STR | EB BLINKING PULSE |
| 0002 AND NOT | IE2 FROST PROTECTION |
| 0003 SET | A1 FROST PROTECTION |
| 0004 STR | E2 SUPPLY AIR AUTOMATIC |
| 0005 AND | IE1 SWITCH CLOCK |
| 0006 OR | E3 SUPPLY AIR MANUAL |
| 0007 AND | IE2 FROST PROTECTION |
| 0008 AND | IE3 OVERCURRENT SUPPLY AIR |
| 0009 SET | IA1 SUPPLY AIR FAN |
| 0010 STR | E2 SUPPLY AIR AUTOMATIC |
| 0011 SET | A2 SUPPLY AIR AUTOMATIC |
| 0012 STR | IE7 ANSWER-BACK SUPPLY AIR |
| 0013 STR | EB BLINKING PULSE |
| 0014 AND NOT | IE3 OVERCURRENT SUPPLY AIR |
| 0015 OR STR | |
| 0016 SET | A3 SUPPLY AIR MANUAL |
| 0017 STR | IE7 ANSWER-BACK SUPPLY AIR |
| 0018 SET | IA3 FLAP |
| 0019 SET | IA4 CONTROL |
| 0020 STR | IE9 ANSWER-BACK CONTROL |
| 0021 SET | A6 CONTROL |

| | | |
|---|---|---|
| 0022 STR | E4 | EXHAUST AIR AUTOMATIC |
| 0023 AND | IE7 | ANSWER-BACK SUPPLY AIR |
| 0024 STR | E5 | EXHAUST AIR MANUAL |
| 0025 OR STR | | |
| 0026 AND | IE4 | OVERCURRENT EXHAUST AIR |
| 0027 SET | IA2 | EXHAUST AIR FAN |
| 0028 STR | E4 | EXHAUST AIR AUTOMATIC |
| 0029 SET | A4 | EXHAUST AIR AUTOMATIC |
| 0030 STR | IE8 | ANSWER-BACK EXHAUST AIR |
| 0031 STR | EB | BLINKING PULSE |
| 0032 AND NOT | IE4 | OVERCURRENT EXHAUST AIR |
| 0033 OR STR | | |
| 0034 SET | A5 | EXHAUST AIR MANUAL |

```
DR 0035-0050
0035  STR              IE7  ANSWER-BACK SUPPLY AIR
0036  AND NOT          IE5  PRESSURE SUPPLY AIR
0037  TIME 20"
0038  OR STR           E7   AIR SHORTAGE SUPPLY AIR RELEASE
0039  SET              HSI
0040  STR              EB   BLINKING PULSE
0041  AND              HSI
0042  SET              A7   AIR SHORTAGE SUPPLY AIR
0043  STR              IE8  ANSWER-BACK EXHAUST AIR
0044  AND NOT          IE6  PRESSURE EXAUST AIR
0045  TIME 20"
0046  OR NOT           E8   AIR SHORTAGE EXHAUST AIR RELEASE
0047  SET              HS2
0048  STR              EB   BLINKING PULSE
0049  AND              HS2
0050  SET              A8   AIR SHORTAGE EXHAUST
```

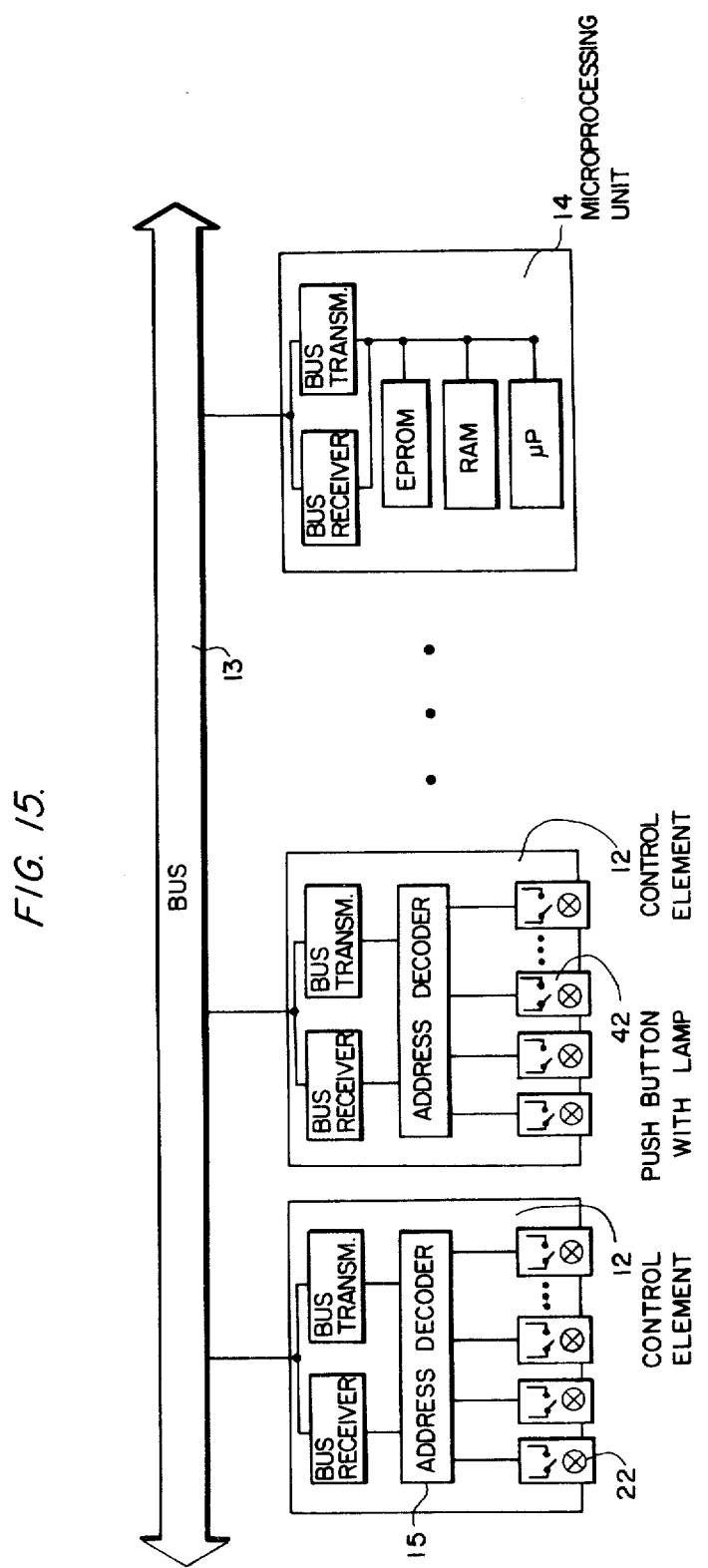

FREE-PROGRAMMABLE, MODULAR CONTROL SYSTEM WITH INTEGRATED USER DEFINABLE DISPLAY AND OPERATING DEVICES

This is a continuation of application Ser. No. 081,793 filed Oct. 4, 1979, now abandoned.

BACKGROUND OF THE INVENTION

The invention relates to a display and control element comprising several lighted push buttons on a board insertable into a casing, constructed so that the buttons may reset each other.

Such display and control elements are already known. In a folder of the company Klockner-Moller, Electronic special G 27-2043, published in 1977 a control system is described, comprising several insertable units usualy each of different construction. The folder describes 16 different insertable units varying in their internal construction as well as their front side design. The different construction of the individual units increases the costs for providing the known system, complicates the planning and extends the time necessary for any changes when the system to be controlled is altered. Sometimes it will even be necessary to order the required new insertable unit from the manufacturer because individual construction costs may be excessive. The same holds true if the units have to be replaced.

SUMMARY OF THE INVENTION

The invention is addressed to the problem of creating a display and control unit which is much more versatile and which is adaptable to practically each application by coding or programming the device even to changes by the final user.

This problem is solved in such a way that the function of lighted push buttons and—if requested—the mutual resetability of the lighted push buttons is provided electrically through circuits, the configuration and setting of which is effected without change of wiring by means of coding switches, crossbar distributors, plug-in connectors or the like, being carried by a plug-in board, or by means of the software (programming) of a microprocessor.

This construction makes it possible to adapt the display and control element to practically every task in a very simple manner. It is only necessary to switch over the crossbar distributors, plug-in connectors etc. or to adapt the stored program of the optional microprocessor in a manner known to the artisan. Dependent on the size of the plant, according to the present invention, several such display and control elements having identical construction may be necessary in which the lighted push buttons of each display and control element—dependent on the required task—may either be used as a control switch (push button) or as a display (signal lamp), or at the same time as push button and display. Since only one type display control element is necessary, optionally supplemented by plug-in boards providing for power supply or acting as the interface between the control system and the plant to be controlled as well as optionally a plug-in board with a microprocessor, this will result in cost reductions not only with respect to the manufacturing of the basic units but also with regard to the installation of the complete system at the plant site.

If more than one display and control element is required, for example, when a very extensive system is to be controlled, several display and control elements may be positioned beside each other and connected electrically to each other for example by multiwire ribbon cable, print boards or the like, and in this situation it is especially useful if all boards are not only of identical construction but also may be connected parallel to each other with respect to the individual contact pins thus very much simplifying the wiring.

The display and control element according to the present invention may be made even more universal if one or several boards, each carrying the display and control element according to the invention, are used in combination with input-output boards optionally provided with relay or opto-couplers and acting as the interface between the control system and the plant to be controlled, where all the boards are insertable into one casing. In addition the casings may be connected with other casings provided with similar boards by data bus lines and, in addition, the casings may be connected to a central device which enables the use of a programming device to feed a microprocessor if such microprocessor is part of the system. According to a further embodiment of the invention the programming device includes a program printer to print out the stored program, especially as circuit diagram symbols. This way it will be much easier to check the stored program.

When one board contains a microprocessor, it is useful if this board is electrically connected with several other boards carrying lighted push buttons and being identical to each other so that the electrical connection may be effected by terminal boards in such a way that individual plug-in pins related to each other are connected parallel to each other.

A further embodiment of the invention comprises a plug-in board with integrated circuits for forming function circuits and set circuits, so that, for example, the display lamps may be operated in a blinking manner without providing a special blinking rhythm therefor. Furthermore, the plug-in board may have semiconductor lamp drive circuits for the operation of the light elements of the lighted push buttons (for example, incandescent lamps or light emitting diodes).

If several boards are used which are controlled by a microprocessor each board should have address code devices, for example, as binary coding switches, plug-in connectors etc. which address code devices determine the function of the push buttons of the board and/or the address of the board, i.e. the position of the board in the scanning cycle of the microprocessor at which the respective board is for instance addressed for scanning the data of such board.

The addressing of the board, however, is not necessarily effected through coding devices being positioned on the board itself. It is also possible to use the position of this board in a group of boards as a code, if the individual boards are not parallel to each other with respect to such address lines but are provided with separate lines for the purpose of addressing. Then the casing for the boards has to be wired in a slightly different way.

If a central apparatus is used, such an apparatus may be provided preferably with an 8-bit microprocessor and supplemented by another microprocessor with storage room for all connected individual push buttons. In addition, an internal fixed working program section and a freely programmable working program section are included. The storage of the internal fixed working program section preferably is provided for by PROM-storage boards with non-volatile content while the storage of the freely programmable working program section likewise is provided for by PROM-storage boards or alternatively by battery buffered storage boards, since in the latter case the working program section is more easily alterable.

In order to test the system before starting up or for regular checking and speedy change and supplementation of the user program, it is preferable to provide special RAM-stroage boards for this purpose. Specific programs already tested may be stored in PROM-storage boards for higher security.

The bus lines, i.e. the data lines between the central apparatus and the individual casings containing the boards may be connected by ring lines which are preferably coaxial cables which transfer based on a data word structure comprising at least 12-bit words plus sign-bit. Via such bus lines, the programming device may also be connected. The programming device, for example, may contain a program printer to print out the stored program, especially in the form of circuit diagram symbols, which method facilitates the checking of the system.

The construction of the individual boards may be simplified, especially the necessary number of elements may be reduced, if a push button is protected against contact jitter by a resistor-capacitor-member, so that special digital jitter protecting means preventing such contact jitter are unnecessary. A further reduction or simplification is possible if all control and storage functions optionally including the mutual resetting of the lighted push buttons are controlled from the central microprocessor.

The boards are preferably provided in a size that is the usual format (for example Europe format or double Europe format), so that they fit into casings or double casings that are presently on the market. For a regular casing a board with five push buttons is specially useful, while for a double casing a higher number of push buttons, for example, 8 push buttons is of special value, so that additional space for further display means already exists, if such additional display means should be considered useful.

It may be noted that by matrixlike positioning of several boards with several lighted push buttons on each board a display surface is provided which can give easily distinguishable information even if observed from a distance.

The display and control element according to the invention is especially useful to control air conditioning and heating installations, ventilating and other systems of the kind in which the use of ring lines is of special value, however, the display and control element according to the invention may also be used for controlling conveying plants, dressing plants as well as other plants where a motor drive is to be controled.

A special advantage of the display and control element according to the present invention is that the lighted push buttons may be marked easily by simply adding paper or transparent labels with inscriptions, symbols or the like.

BRIEF DESCRIPTION OF THE DRAWINGS

The invention is further explained with the aid of drawings representing embodiments thereof, wherein:

FIG. 3b is a side elevational view of the board shown in FIG. 3a;

FIG. 7 is a connector list for the input-output board of the plant shown in FIG. 6;

FIG. 9 is programming plan of the air conditioning plant of FIG. 6;

FIGS. 10, 11 and 12 are examples of the program printing by the program printer corresponding to the embodiment shown in FIGS. 6 to 9;

FIG. 15 is a block diagram of several boards and a microprocessor board connected by a bus.

DESCRIPTION OF THE PREFERRED EMBODIMENTS

Figure 1:
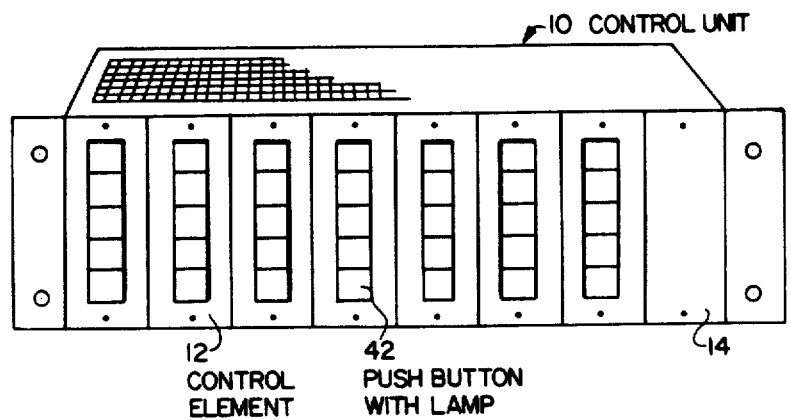
FIG. 1 shows a control unit comprising several display and control elements according to the invention (plug-in boards)

FIG. 1 shows a perspective presentation a control unit 10 comprising a casing with—in the shown embodiment—seven identical display and control elements 12, in the form of insertable boards. One of the display and control elements is shown in more detail in FIG. 2 likewise in a perspective presentation. FIG. 1 shows, in addition, a further insertable unit 14 of a different construction carrying for example a microprocessor.

The control unit 10 may be accomodated along with further control units in the usual way for example with a switch cabinet (not shown) which in addition contains all those elements otherwise necessary for the control of the correspondent system belonging thereto, for example power supply, survey measuring devices, power relays, auxiliary power relays, interlocking means etc.

Figure 2:
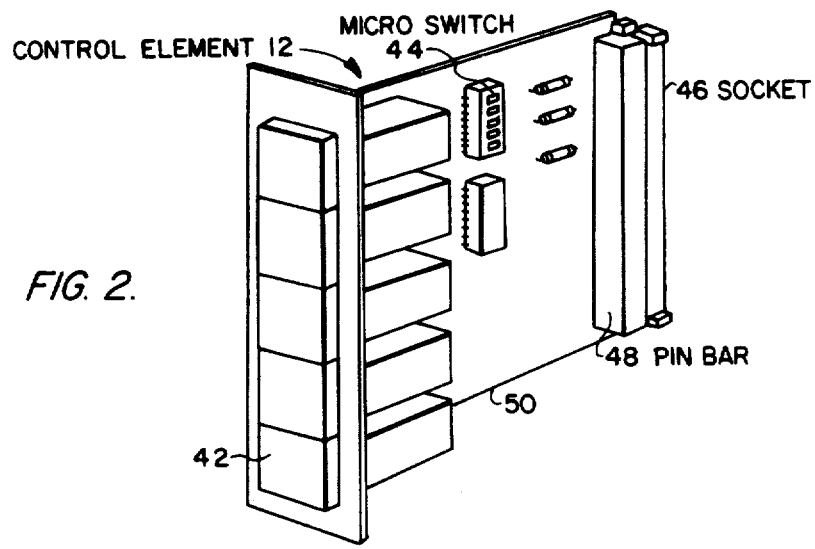
FIG. 2 is a perspective view of one of the plug-in boards of control unit according to FIG. 1, comprising five lighted push buttons as well as microswitch groups (coding switches) for determining the function of the lighted push buttons.
Figure 5:
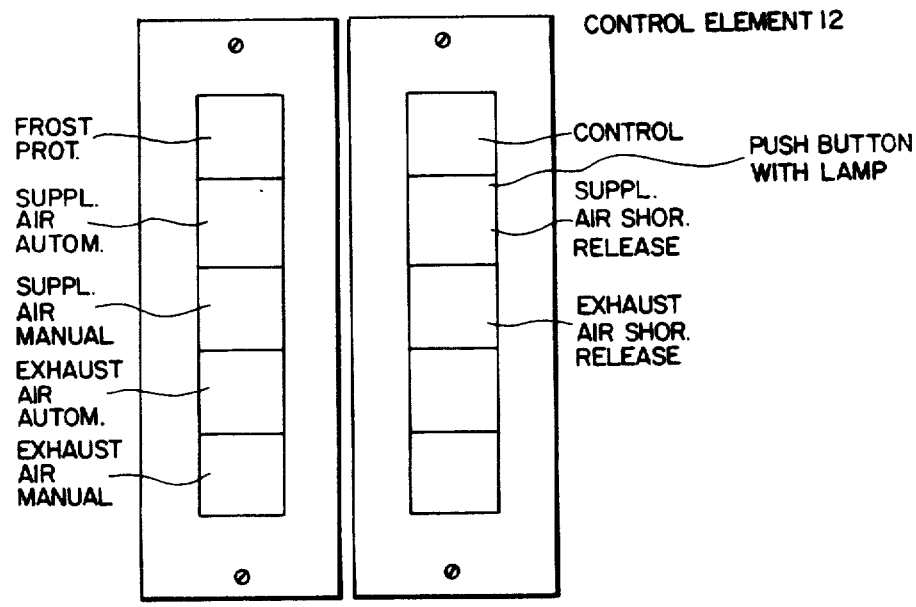
FIG. 5 depicts two display and control elements provided one beside the other.

The display and control elements 12 as shown in FIGS. 1 and 2 comprise rectangular lighted push buttons 42 which are positioned closely side by side or one above the other respectively. A specific function is related to each individual lighted push button 42 and the function may be marked on the front surface of the button by correspondent illuminated legends, see FIG. 5, for example, in a simple manner by the use of transparent paper 16 marked by black ink. The paper may be protected by a transparent acrylic glass cap 18, which transfers the actuation pressure being applied by a finger tip onto the actuation slide 20 (FIG. 3b). The slide 20, for example, is likewise made from plastic, so that cap 18 is attachable to such slide 20. The actuation slide contains in its inner part a socket (not shown), into which a signal lamp or a light emitting diode 22 may be inserted. The terminals of such signal lamp 22 are connected, for example, with 2 pins 24, by which the electrical connection is possible with the printed board circuit of the printed circuit board 50.

Each push button comprises preferably a two pole switch-over contact, and the two times three terminals thereof being likewise connectable by means of pins 26 wth the circuit of the printed board. The pins 24 and 26 preferably may be used at the same time as mechanical mounting means for the push button onto the printed board 50.

Figure 3A:
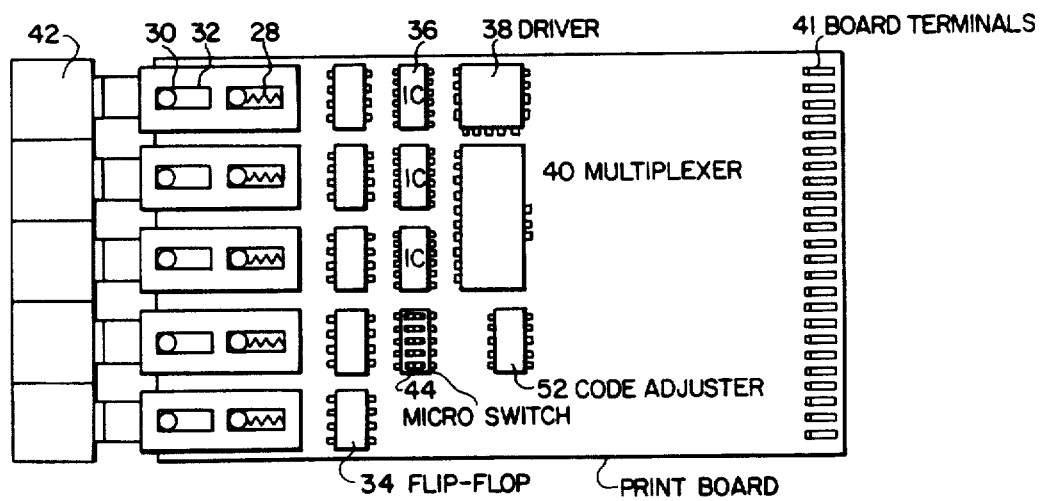
FIG. 3a is a view from the top onto a similar embodiment.
Figure 3B:
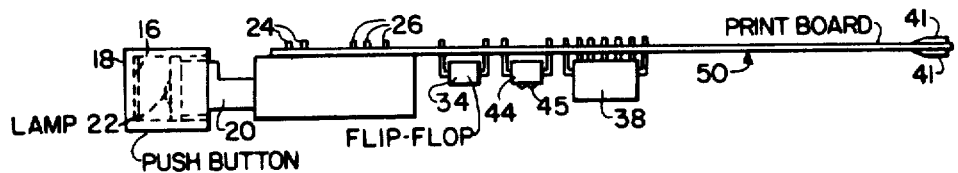

As especially can be seen from FIG. 3a, the push buttons are urged in the outward direction to their rest position by means of spring 28, where the stop stud 30 connected with the movable part abuts against the one end of a slit 32 provided in the fixed part of the button. By pressure of the finger the push button may be moved against the pressure of spring 28 so far that the stud 30 abuts at the other end of the slit 32. The two end positions of the push button correspond to the two throw over contact positions of this push button switch.

The insertable board 50 carries in addition to the lighted push buttons flip-flop circuits 34 which work as storage, especially in the shown embodiment, one flip-flop 34 for each light push button 42. These storage units are used for storing the signal being provided by pressing down the push button until the stored signal is cleared or reset by a new actuation of the same lighted push button or is replaced by another signal. This kind of storage is especially useful if the correspondent lighted push button works as a control element. If, however, the lighted push button is only used as a display element the correspondent flip-flop 34 works in such a way that the pulse like signal to be displayed is stored and the lamp 22 is illuminated as long as the state of the storage or flip-flop 34 is not changed, and if the state is changed the lamp extinguishes or—in case of more complicated circuits—starts a blinking operation.

A signaling service of that kind may be, for example, provided by one or more integrated circuits 36 which integrated circuits are able to provide an oscillating driving pulse for the lamp.

To provide the light elements 22, either light emitting diodes, incandescent bulbs, glow lamps etc. with the necessary operating power from the printed board 50 may be used and in addition a lamp driver 38 providing the energy necessary for the operation of the lamps is provided which is controlled by the data signals. The required energy for the operation of this driver and the light push button lamps may be supplied to the printed board 50 via one of the various terminal contacts 40, for example as a DC voltage of 12 volts.

On the printed board 50, furthermore, a group of microswitches 44 comprises 5 miniaturized throw-over contacts which may be changed manually by means of small whips 45 and which act as coding switches.

The coding switches may be replaced by corresponding plug-in connector means of specific coding.

In the embodiment just described the individual display and control elements are connected with a microprocessor which at the same time controls several printed boards. Therefore, the respective printed boards comprise in addition a multiplexer 40 as well as an address code adjuster 52, by means of which it becomes possible not only to individually scan the different boards to be controlled by the microprocessor (by means of the address code adjuster 52), but also to scan the individual push buttons (by means of multiplexer 40). The cyclical scanning by a microprocessor is known so that it is not necessary to describe this procedure in detail, however, it may be noted that the multiplexer is working like a rotary switch which under the control of the clock of the microprocessor connects the output of the multiplexer, which is connected to the microprocessor consecutively with the individual push buttons 42 and their storage 34, respectively, thereby reading the stored data and transfering same to the microprocessor or for writing data into the storage 34 which are provided by the microprocessor.

The function of the storage 34, by the way, may be provided by the microprocessor itself since the cycle period of the microprocessor is so short that even a momentary pressing down of one of the lighted push buttons lasts much longer than the time of one processor cycle, so that the fact that a push button is pressed down is noticed by the microprocessor within the period of one cycle and may be stored accordingly in its own storage. In this case the storage elements 34 may be removed. Also, the function of the integrated circuits 36 may be provided by the microprocessor, so that also these integrated circuits may be removed.

Even the function of the group of miniaturized switches 44 could be provided by corresponding programming of the microprocessor. That is, by respective software in the microprocesor it may be fixed which of the five (or more) lighted push buttons may, for example, only function as signal elements and which push buttons may serve as control elements. Further, how far the individual push buttons influence the function of other push buttons (i.e. mutual resetability) may be controlled. Thereby the elements on the printed board 50 are reduced to the drive element 38, the multiplexer 40 and the address code adjuster 52, which adjuster, for example, may again take the form of a group of miniaturized switches or of plug-in connectors.

A very simple construction of the display and control element is provided since the individual elements may be manufactured identical to each other and it is only necessary to adjust the function of the individual lighted push buttons either by the manufacturer or the user in such a way that a respective actuation of, for example, the groups of miniaturized switches 44, 55 or a respective programming of the microprocessor is effected. Furthermore the legends 16 on the lighted push buttons 42 can be inserted and the caps 18 mounted. Programming of the microprocessor is possible without difficulty my means already on the market, and more details of this aspect are described later.

The individual insertable boards comprise on their back on both sides of the printed board terminals 41, for example 40 such terminals. By inserting the printed board into a respective socket electrical connections are provided between such terminals 40 and the wiring which is present inside of the casing 10. According to FIG. 2 the connection between printed board 12 and the wiring is effected by means of an insertable socket 46 and a pin bar 48.

The insertable socket 46 of the different insertable boards 12 being in the casing 10 may be connected in parallel to each other if a microprocessor is used, so that also the wiring inside of the casing is extremely simple since all display and control elements in the form of insertable boards may be connected in parallel to each other with respect to their individual contacts 40.

As shown in FIG. 1 the casing may house up to seven identical display and control elements 12, where each element has five lighted push buttons 42, while the remaining free space may be occupied by a further insertable board 14 carrying a power unit, the microprocessor or again lighted push buttons.

The display and control element according to the invention is appropriate for many very different applications, however, especially useful are these display and control elements for freely programmable control unit systems, for example an air conditioning plant as shown in more detail in the embodiment described as follows.

Figure 4:
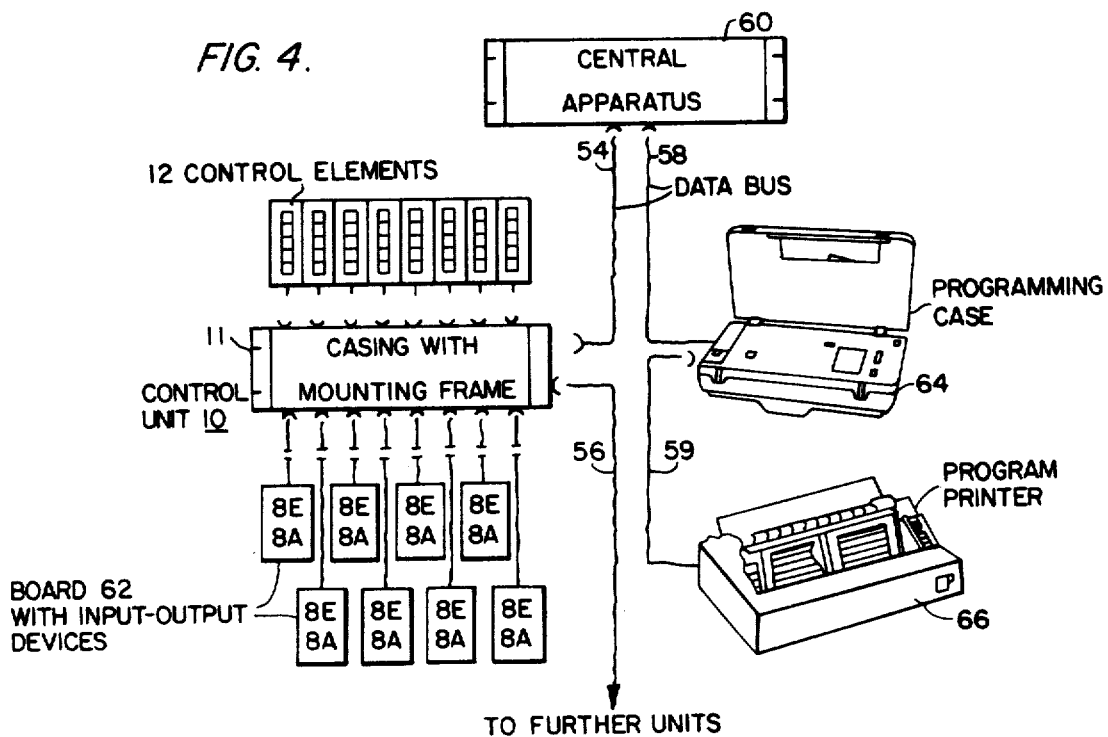
FIG. 4 is a control unit comprising several display and control elements in connection with a central apparatus, a programming case and a program printer.

Such a control system comprises, see FIG. 4, for example a central apparatus 60 connected by means of data bus 54 to a first control unit 10, containing a casing 11 and up to eight display and control elements 12 or the kind described before. The extension of such data bus 54 (data bus 56) allows the connection with further control units, if required, which units are not shown and, however, are of identical construction as control unit 10.

A further data bus 58 is, according to FIG. 4, connected to a programming case which leads via data bus 59 to a program printer.

As may be understood from the schematical presentation of FIG. 4, up to eight display and control elements 12 in the form of insertable boards are plugged in a mounting frame 11 (for example a 19 inch size frame) to which the data bus 54 and 56 are connected. Furthermore, the mounting frame 11 is in connection with additional insertable boards 62 containing input/output devices. Such input and output boards 62 are used as interfaces between the control system and the plant to be controlled, which plant is not shown here. Each input and output board 62 comprises eight inputs (8E) and eight outputs (8A).

Figure 13:
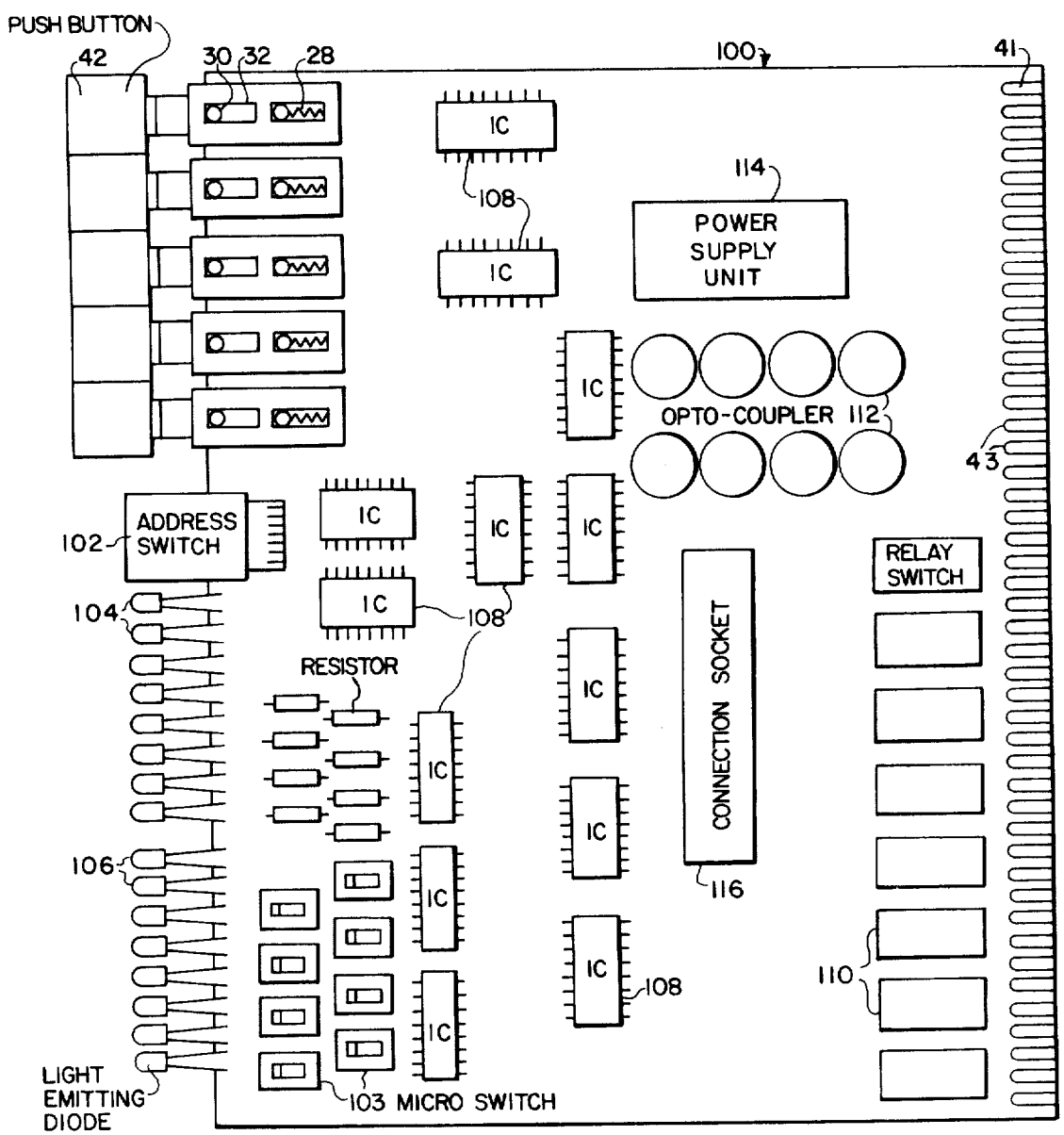
FIG. 13 is a plug-in board being used as a control board.

Instead of using different boards for the display and control elements 12 and for the input and output boards 52 which are separately insertable into the mounting frame 11, as shown in FIG. 4, it is possible to combine a display and control element 12 with an input and output board 62, thereby providing a "control board". The control board has the advantage that the number of insertable boards to be placed in the mounting frame 11 is reduced to one half, the wiring of the mounting frame is, of course, much simpler and the necessary number of contacts is reduced. The control boards provided in this way again may be identical to each other, for example as shown in FIG. 13.

The control board 100 shown in FIG. 13 is again a printed board, which, however, is larger than the printed board shown in FIG. 3. This board again has five lighted push buttons 42 being positioned side by side, which lighted push buttons may be identical to those shown in FIG. 3a. The lighted push buttons may be placed for example at the other end of the facing edge of the printed board. Likewise at the facing edge below the push buttons 42 there is provided an addressing switch 102 by which the address for this control board 100 is adjustable so that this control board may be scanned from the central apparatus 60. Since the system shown in FIG. 4 uses several control units 10, each having up to eight control boards 100, the addressing switch 102 has two preset disks 105 and 107, by which the numbers 1 to 8 may be selected. The preset disk 107, thereby, characterizes the respective control unit 10 while the second disk 105 selects the control board 100 of the control unit 10. The selected coding is visible from the outside of FIG. 14.

Below the coding switch 102 there are two groups of eight light emitting diodes 104 and 106. The light diodes 104 may be colored for example green, to characterize the condition of eight external inputs, while the light diodes 106, may be of red color to show the condition of eight external outputs. The drive circuits necessary for the control of light emitting diodes and lighted push buttons as well as connecting circuits and storage means are implemented by several integrated circuits which have the reference numeral 108 in FIG. 13. Furthermore, the drawing shows eight relays 110 mounted on the control board 100 which are provided for actuating external relays etc. and which cause galvanic isolation between the control circuits of the control board 100 and the control signals forwarded to the plant to be controlled. A similar galvanic isolation is provided between the external input signals and the signals of the control board 100, in this embodiment, by means of eight opto couplers 112. Such galvanic isolation between external input and output signals and the internal signals of the control board 100 enhances the security. In addition, the voltage potentials of the control signals are usually quite different, where the input signals received from sensors etc. as well as external output signals for the plant to be controlled are typically alternating current signals with a voltage of for example 220 V, while the potentials of the signals transferred between the elements of the control board 100 are in the order of 20 V.

Likewise for further galvanic isolation the control board 100 includes its own power supply unit 114, converting for example alternating current of 24 V or 220 V provided by one of the terminals 43 into the direct current of for example 12 or 20 V necessary for the operation of the elements of control board 100.

In this embodiment the connection terminals have different size, and the smaller terminal contacts 41 are used for connecting the data bus 54 and 56, while the broader terminals 43 are able to carry higher currents and are used to receive input signals from the system to be controlled and to provide the system with output signals.

The control board 100 includes a terminal line for setting time units being implemented by hardware, the function of which will be specified in more detail later on.

Finally eight test microswitches 103 are on the board which for checking purposes are used to provide the input and output elements of the control board with manually determinable signals instead of signals supplied by the electronics.

Figure 14:
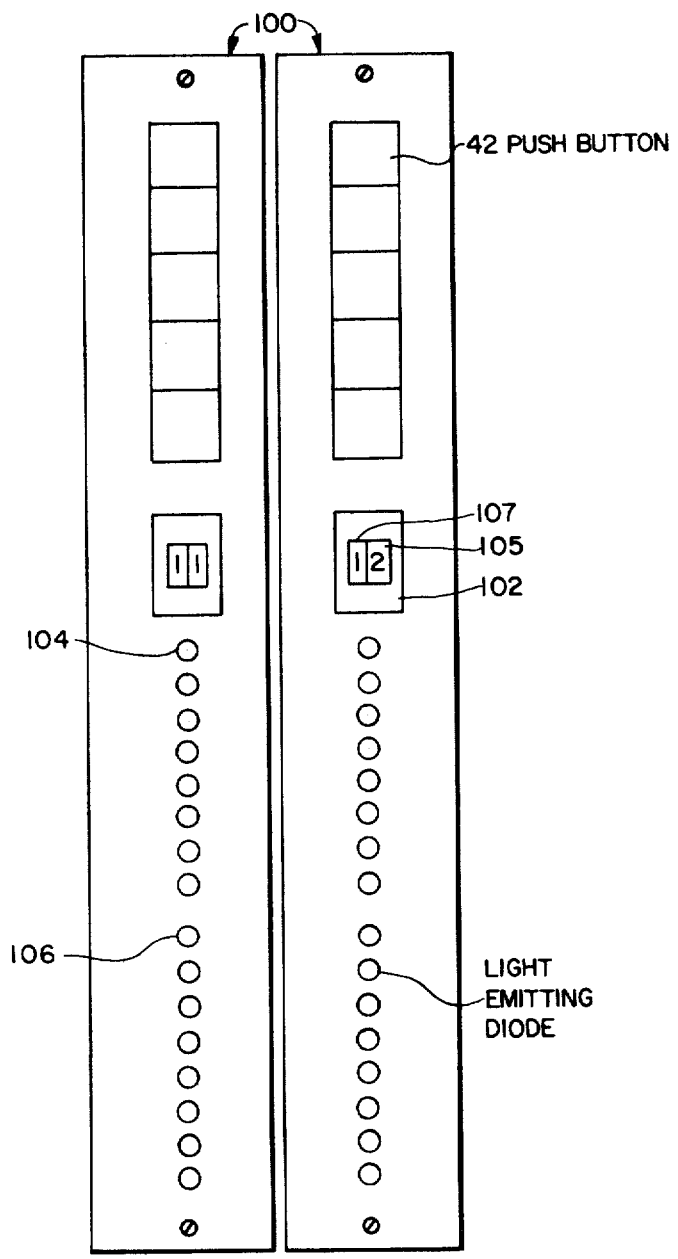
FIG. 14 is a front elevation view of two control boards according to FIG. 13 being positioned one beside the other.

FIG. 14 shows two control boards 100 side by side inserted into a frame (not shown), whereby the coding switches 102 of one control board has the coding 11 and the other the coding 12.

FIG. 15 illustrates several control element boards 12 and a microprocessor board 14 connected by the common parallel back plane bus 13 in the casing 10. The control element boards 12 connected to the bus 13 include a bus receiver and transmitter acting as a bus interface circuit and an address decoder for selecting the lighted push buttons.

For the following more detailed description of the invention it should be noted that the input terminals of the different inputs are marked by E1, E2 ... E7, E8 and the output terminals with A1, A2 ... A7, A8 (base of the relay), 10, 20 ... 70, 80 (opening contact of the relay) as well as 11, 21 ... 71, 81 (closing contact of the relay) respectively. The addressing of inputs and outputs may be effected in such a way that the first input of the first insertable board is marked 1E1, the fifth input of the first insertable board 1E5, the seventh input of the sixth insertable board 6E7, the third output of the first insertable board 1A3 etc.

To implement the various conventional control switch functions by means of the new display and control elements it is useful to have software stored in the central apparatus. For this software program each push button serves as input, each lamp as output. Correspondingly the addressing is effected in such a way that for example push button 1 of the first insertable board or control board is marked E1, the push button 5 of the first board E5, push button 5 of the second board E10, lamp 1 of the first board A1, lamp 5 of the first board A5, lamp 5 of the second board A10 etc.

The following control switch functions are preferably stored in the software and—depending on the configuration of the plant—are allocated to individual control boards, even in a random manner:

1. No mutual resetting of the push buttons, i.e. each push button is working independently: pressing the push button once=on; pushing again=off;
2. two lighted push buttons reset each other mutually; three push buttons are independent;
3. two push buttons reset each other; two further push buttons reset each other; one push button is independent;
4. two push buttons reset each other; three further push buttons reset themselves mutually;
5. three push buttons reset each other mutually; two push buttons are independent;
6. four push buttons reset each other mutually; one push button is independent;
7. five push buttons reset each other mutually.

If more than five push buttons are present, the number of possibilities increases.

The function to be applied to each control board is chosen during the planning of the plant. Possible programming may be effected optionally on each control board by three coding switches coded in binary form.

Switching on the switching off of an external output is effected by the same push button. If push buttons are provided which reset each other, functions such as "manual automatic" or "automatic - step 1 - step 2" are implementable. For these programs the switching off is effected by actuating the push button which was previously set.

Since all push button instructions are only put in as pulses these pulses have to be stored in an internal storage as a static order. Each input of a pulse, therefore, changes the status of the storage (flip-flop function). A set condition, therefore, is altered either by actuating the same push button (if no mutual resetting is provided) or by actuating another push button (if mutual resetting is provided). If several push buttons are actuated simultaneously, there is no change of status.

The storage places which are occupied by the push buttons have to be continuously accessable by the user program for information on the present status. The addressing of those storage locations is similar to the addressing of the push buttons, i.e. E1, E2 . . . En.

Since the push buttons in some cases are only used as pulse generators, the possibility of moving the program of the user out of the ROM storage into a RAM storage exists.

All push buttons may be turned off by a key switch in the central apparatus. In this case the condition of the storage remains unchanged.

If the lighted push buttons are only used as display lamps the storage locations of these push buttons are not read out.

In the shown embodiment the control system consists of up to 160 push buttons, so that for the push button functions it has to have at least 160 storage locations.

The central unit 60, which is shown in FIG. 4, may contain for example a key switch for the main power supply, a key switch to turn all push buttons off, a push button for a lamp test (if actuated all display lamps of the system should flash up thus checking whether all lamps are operable), and further push buttons for other purposes, for example to deliver an input (like EO) to the storage.

Furthermore, the central apparatus 60 may contain an 8-bit microprocessor (for example the type Motorola of family 6800), in combination with a 1-bit microprocessor (for example Motorola family 14500).

Furthermore, there is provided a storage to store the internal working program, whereby the content of such storage is saved even in case of power failure (implemented for example by a PROM storage).

Furthermore, there is provided a storage for the free programmable part either in the form of a RAM memory, which is battery buffered, or in the form of a PROM storage with non-volatile content.

The RAM storage board is used for checking the system or for amendments and supplements of the user program in a fast and effective way. The storage may contain for example 4096 words whereby each word equals one logical function.

While the RAM storage board may be removed from the system the PROM storage board is left in the test system. The storage content of the PROM storage board should be at least 1024 words (1024 logical functions), however, it is desirable to have spare sockets for extending the storage means to at least 4096 words.

It is preferable to use a buffer battery to make sure that in case of power failure the last pulse of the control push buttons is stored (although the lamps may extinguish), so that as soon as the power is returned the preset push button functions return.

In order to decentralize the circuit cabinet there should be the possibility of data transfer via an external ring line (coaxial cable). The data word structure to be transferred should at least comprise twelve bit words plus sign bit, resulting in a word length of 16 bit. If this more advanced version is used the input/output boards for converting the instructions external to the circuit cabinet are not required.

The central apparatus 60 comprises several software packages. For example, there is stored an internal self-checking program effecting a stand-still in case of a detected error, whereby the error storage EO is set. Simultaneously, an auxiliary apparatus is started. If no standby system is connected all outputs are put to a defined logical zero condition.

Furthermore, the lamp test already mentioned is stored in the mode of a program according to which all lamps of the system will flash up if the push button "lamp test" is actuated.

At a specified address there should be stored a blinker pulse of for example 0.5 secs duration and 0.5 secs interval between two pulses.

Furthermore, there are programs for logical interconnection units which may be programmed as required by the user, see the following more detailed specification.

With the aid of the programming device shown in FIG. 4, comprising the programming case 64 and the program printer 66 the following statements may be put into the central apparatus:

(a) Input of reservation lists in clear text (up to 20 letters per line);
(b) input of logical functions by means of one push button each AND; OR; NOT; HS (auxiliary storage); VR (locking); E (input); A (output); AIM (switch to output); STR (beginning of a new current line);
(c) selecting of the address (keyboard with numbers 0 to 9);
(d) clearing (clear the display);
(e) read (read the content of a storage location);
(f) insert (insert an additional logical function in case of a RAM storage operation);
(g) print (print program);
(h) load the magazine with user program;
(i) load the E-PROM with user program for RAM storage or magazine; and
(k) load the user program in the storage.

On a display comprising one line the following is shown: selected storage location in the user area and furthermore the logical function of the selected storage location as well as the word written into the location in clear text (up to 16 letters).

Each logical function button may be provided with a light emitting diode (LED) which shows optically the program being put in as soon as the storage location is selected.

Figure 11:
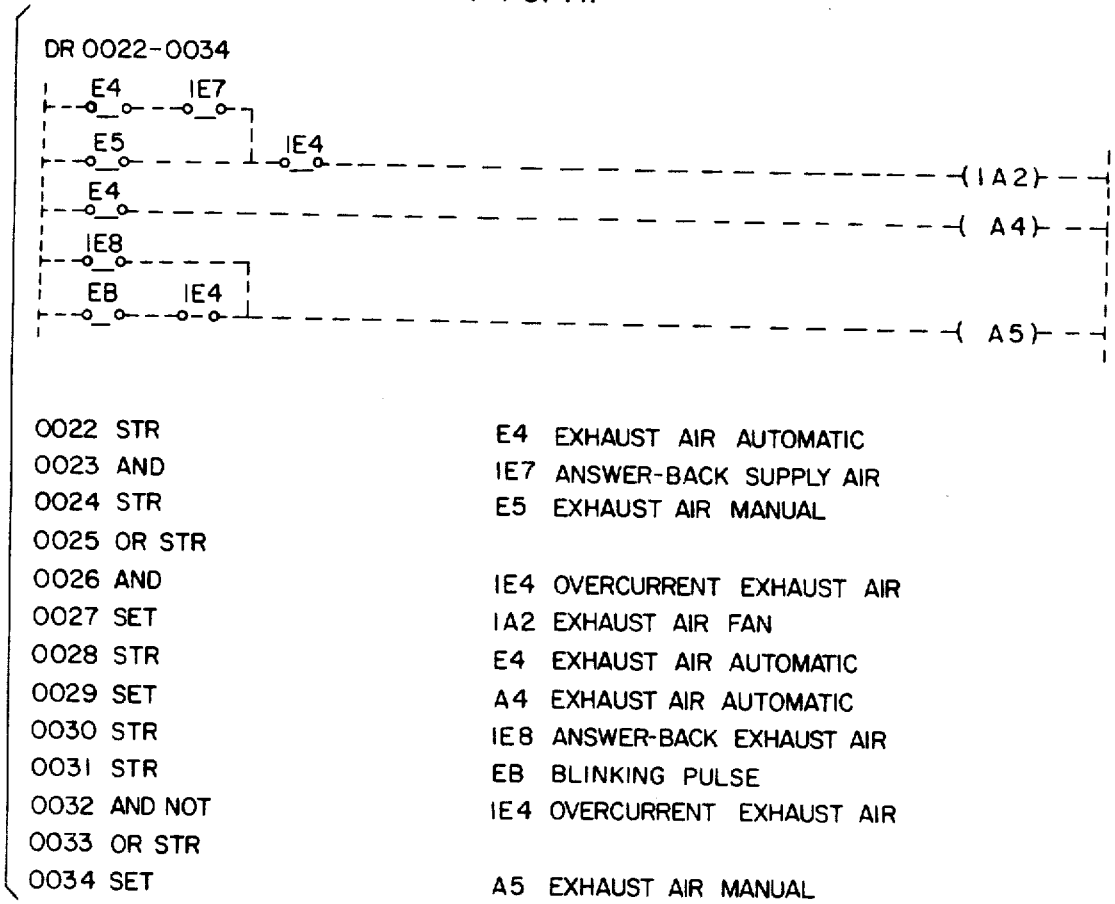
Figure 12:
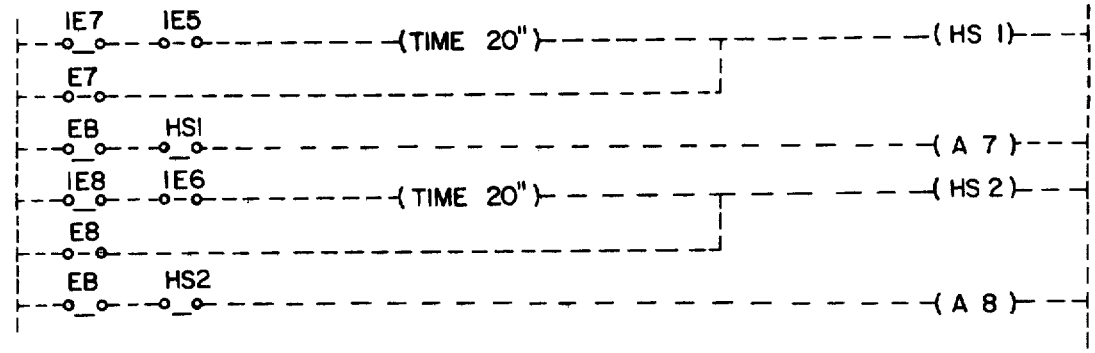

The user program may be printed by pressing down the respective push button "print" of a printer (needle printer) attached thereto, preferably as a circuit diagram, see FIGS. 10 to 12.

The programming device comprises a built-in tape recorder (the tape being in a cartridge form) to record the user program including the lists of storage occupation.

In the following the use of the system containing the display and control element according to the invention will be described in connection with an example for programming whereby the advantages of the free programmability will become especially clear.

The programming is effected with circuit diagram symbols. Especially useful is for example the programming system 5TI of Texas Instruments, U.S.A., so that this kind of programming is used as base for the following example.

The following logical interconnection and functions are at the disposal of the programmer:

and = series connection of two or more arbitrary closing contacts;
or = parallel connection of two or more closing contacts;
not = change of the closing contact to an opening contact;
time = selection of a time function, whereby by means of corresponding programming switching on or off is delayed. By additional programming of a time of delay variabile time dependencies may be implemented. Resetting is effected through the user program. For example, delay times of 0.1 secs up to 30 min are possible, using 256 time elements which are insertable as a set into the plug-in line as shown in FIG. 13, while the time functions are implemented only by the software, i.e. related from the program.
counter = selecting a counting function whereby by the programmed counting forward or backward is possible. By way of further programming also a clock of variable count duration is possible. Reset to 0 again is also possible by the user program. If 64 count elements are used counting from 1 to 1024 is possible.
HS = auxiliary storage: internal storage for the user program. This auxiliary storage is similar to the relays of conventional plants. The auxiliary storages are readable as often as necessary and may be present in a number of 1024 pieces.
VR = blocking: This means the programming of a blocking function ahead of a programmable number of outputs whereby those outputs are maintained disabled (even if the output function of its own should be "true"), until the blocking function becomes "true".

All logical functions are readable as often as necessary by the user program and may be used also in chains of interconnections.

Figure 6:
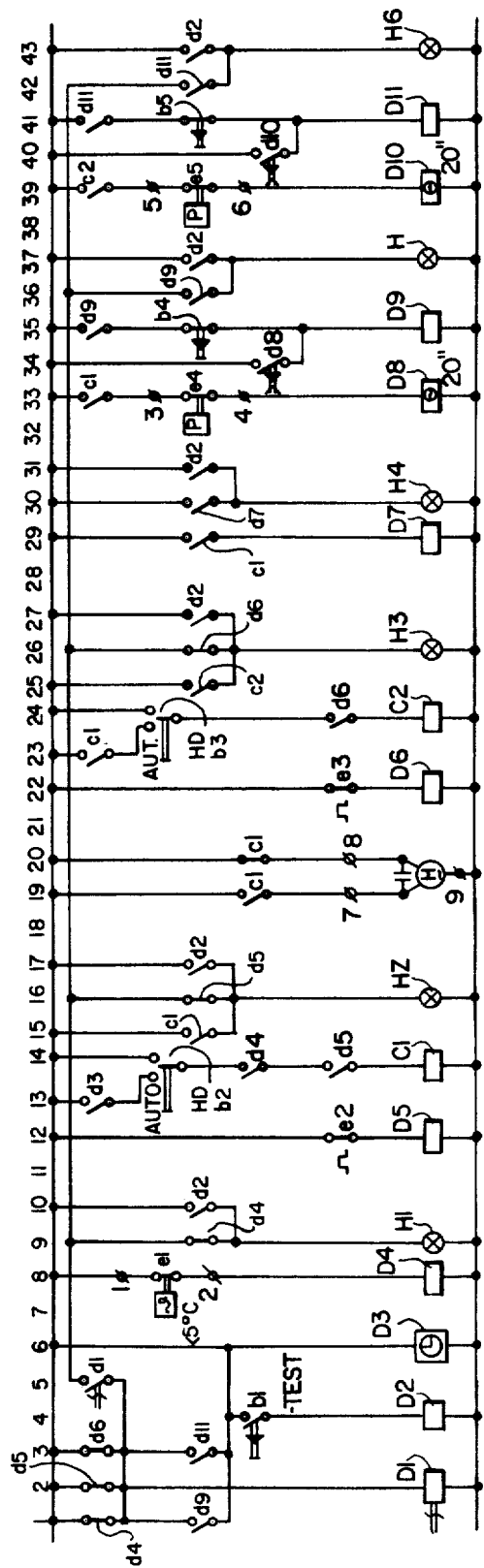
FIG. 6 schematically illustrates an air conditioning plant which is controlled by auxiliary relay, to describe an application of the present invention.

FIG. 6 shows schematically an example of an air conditioning plant. A supply air ventilator relay Cl (see column 14) is enabled if switch b2 is in position "automatic", if at the same time the contact d3 being dependant on time switch clock D3 is closed and at the same time the contact d5 as well as a further contact d4 of a relay D5 being actuated by an excess current trip e5 are closed. The contact d4 is actuated by relay D4 the function of which is dependant on a freezing protection thermostat e1 (column 8). If the temperature is higher than 58° C. and if excessive current is not present the contacts d4 and d5 are closed and relay C1 therefore closes the contact c1 (column 15) and the lamp indicating supply air flashes on. Furthermore, by corresponding contacts c1 in columns 19 and 20 a motor for adjusting the airstream flaps is actuated and a flap for the outer air is opened. The exhaust fan (column 26) is enabled by way of contact c2 (column 25), which is actuated by relay C2, if, in case of absence of excessive current (excessive current sensor E8 and corresponding relay D6 in column 22), the contact d6 in column 24 is closed and furthermore the switch b3 is in position "automatic", and if, by the enabled supply air fan, also contact c1 is closed which is shown in column 23. At the same time the indicator lamp H3 "exhaust air" is enabled. By switching over the switches b2 and b3 respectively to switch position "hand" the fans may be actuated independently from the control system.

In case of a danger of freezing (temperature lower than 5° C.), the sensor contact e1 shown in column 8 is opened whereby the contact d4 in column 14 is opened and, in column 9, the contact d4 is closed which leads to blinking of the freezing protection lamp H1, disabling of the fan and closing the outer flap.

Figure 8:
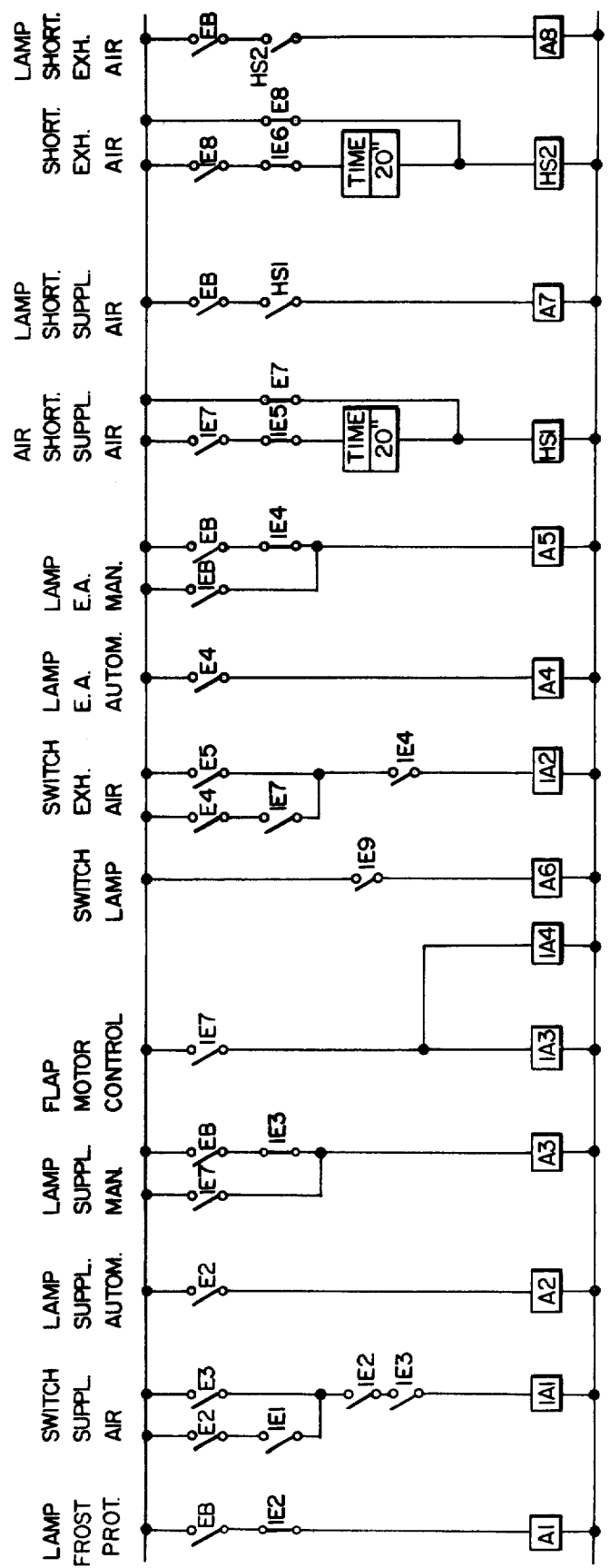
FIG. 8 is a circuit diagram of the air conditioning plant of FIG. 6.

In FIG. 8 there is shown a schematic diagram of the construction of a control device for an air conditioning plant using the display and control elements according to the invention.

The symbols shown in FIG. 8 have the following meaning:

EB = blinking pulse
E2 = air supply automatic
E3 = air supply hand
E4 = exhaust air automatic
E5 = exhaust air hand
E7 = air supply deblocking in case of air deficiency
1E1 = switch clock
1E2 = freezing protection
1E3 = excessive current, air supply
1E4 = excessive current, exhaust air 1E5 = pressure supply air
1E6 = pressure exhaust air
1E7 = feed back air supply
1E8 = feed back exhaust air
1E9 = feed back control
A1 = freezing protection
A2 = supply air automatic
A3 = supply air hand
A4 = exhaust air automatic
A5 = exhaust air hand
A6 = control
A7 = air deficiency, air supply
A8 = air deficiency, exhaust air
1A1 = supply air fan
1A2 = exhaust air fan
1A3 = flap
1A4 = control The addresses mentioned above without prefix are push buttons or signal lamps. Addresses with prefix are external inputs and outputs via an input/output panel. by using the abbreviations it is possible to remain within the limit of 20 signs per line in the list of occupied storage locations.

In FIG. 7 is shown how the connection of the terminals of the input/output board (FIG. 4) or of the control board (FIG. 13) may be effected. According to the drawing the wiring takes place in the switch cabinet, i.e. the connection between the input/output boards (or control boards, respectively) and the corresponding relay contacts or output terminal contacts. By providing the concept of the function by means of a circuit diagram, see FIG. 8, the corresponding address numbers are shown. It is considered that the blinking pulse is provided by address EB, while the lamp test is provided generally and, therefore, is not specially programmed.

By means of the programming apparatus 64, 66, see FIG. 4, it is possible to store the user program step by step based on the input and output reservation lists and the function concept (FIGS. 7 and 8). The programming is done in two steps:

(a) Writing of the input/output reservation lists line by line in clear text into the internal RAM memory of the programming apparatus, whereby a continuous monitoring of the written text is possible by the display of the apparatus. Including the blanks 20 signs are possible for each line, if the typical programming devices are used. Changes, extensions and the insertion of lines are possible. With the device up to 1024 lines are storable.

(b) Now the function concept is loaded via keys with logical symbols into the RAM storage in the control system being used for testing the plant. Again changes, extensions and insertion of words are possible. On the display of the programming device it is possible to constantly monitor which function is in which storage location. By means of light emitting diodes, it is immediately possible to see if the content of the storage location is "true" or not. Storage locations may be cancelled or reloaded as often as necessary.

FIG. 9 for example shows how, by means of individual keys, a program may be loaded corresponding to the diagram of FIGS. 7 and 8, whereby by means of key "STEP" the next storage location may be addressed, while key "LD" (load) makes it possible to write a function into the storage, while the key "SET" (set) addresses an output and by key "STR" (current line) the next current line is selected. By key "NS" (do not store) the next static instruction of a key is used merely as pulse generator.

Accordingly, by using the keys as shown in FIG. 9 the following is effected: by pressing key STR the first current line (in FIG. 8 this is the current line at the left end of the drawing, intended for freeze protection) is selected. By pressing the keys E and B the blinking pulse EB is addressed and by subsequently actuating the key "LD" this function is written into the storage. By actuating the key "STEP" the next storage location 0002 is addressed. By actuating the keys "AND" "NOT" and of the keys 1, E, 2 and "LD" the function "AND NOT 1 E 2" and not 1E2 is loaded at storage 0002.

By pressing the key "SET" the output is selected which was addressed by pressing down the keys A and 1. By actuating the key "LD", therefore, the function "SET A 1" is loaded at storage location 0003.

Correspondingly the input of the program is continued in the following lines.

The individual insertable boards have, as already specified, unique codings which may be implemented by coding switches or by plug-in connectors. The individual reset functions of the push buttons are preferably coded in a binary manner, whereby the seven different possibilities listed above have reference numerals 1 to 7. In the present case the insertable board shown in FIG. 5 on the left side has to be coded with function 3, according to which one lighted push button is independant, while two lighted push buttons reset each other mutually and while two further lighted push buttons likewise reset each other. The second insertable board shown in FIG. 5 on the right side should be loaded according to function 1, i.e. that the lighted push buttons are all independant from each other.

Using the program printer 66, shown in FIG. 4, the stored program can be printed as a wiring diagram, while the content of the storage locations addressed for printing out is printed out.

In the wiring diagram at the switching symbols are printed out the addresses. For better understanding of a function the user program is printed completely below each circuit diagram section. This print section contains the storage location number, the logical function, the address and the text in clear legend of the address.

For this text in clear expression the reservation list is used which was loaded at the start of the programming. The program loaded according to FIG. 9 may be printed by the printer according to FIGS. 10, 11 and 12. In a circuit diagram a chain up to ten symbols long may be located one after the other.

Finally, it may be described once more the simple sequence of operation to be followed when plotting or, if required, altering, for example, an air conditioning plant by means of the inventive display and control system.

The following steps are necessary:
1. Evaluation of the necessary display and control elements and the corresponding input/output boards;
2. affix legends onto the lighted push buttons of the display and control elements and coding the same;
3. providing the input/output reservation lists according to FIG. 7 (may be effected in handwritten form);
4. providing the terminal reservation plan for the input/output boards;
5. mounting the input/output boards in the switch cabinet and wiring according to the terminal reservation list;

6. providing the interconnection concept according to FIG. 8 (may be effected in handwritten form);
7. providing the control system with the display and control element boards;
8. providing the system with a RAM storage board;
9. loading the input/output reservation list into the storage of the programming device (FIG. 9);
10. loading of the interconnection concept by means of the programming device into the RAM storage of the control system;
11. testing of the program by means of a simulator;
12. changing and amending of the program if necessary;
13. transferring the RAM storage content into a PROM storage;
14. replacing the RAM storage board of the control system by such PROM storage board;
15. printing out the complete program (FIGS. 10 to 12); and
16. loading of the complete program on a magnetic tape cartridge including the input/output reservation list for the purpose of permanent filing.

We claim:

1. An electric display and control unit, comprising:
   (a) at least one control element comprising several push buttons, each push button being combined with signal light means, whereby all the push buttons with signal light means are mechanically and electrically of equal construction, and a plug-in board, the push buttons with signal light means being provided on one end of the plug-in board in a side-by-side relationship in such a way that with the plug-in board being in working position the push buttons with signal light means are visible and operable individually from the front side of the control unit, each push button with signal light means being connected through an electronic driving circuit means to a backplane bus for providing necessary interfacing to the backplane bus, and connected to address decoding means for selecting one of the push buttons with signal light means of the control element and/or the control element if there is provided more than one control element;
   (b) at least one processing unit mounted on a plug-in board of the same size as the plug-in board of the control element, the processing unit comprising a microprocessor (P), memory circuits (RAM, EPROM) having a program stored therein and being connected to the microprocessor (P) and interface means connecting the microprocessor (P) and memory circuits (RAM, EPROM) to and from the backplane bus, the microprocessor (P) and the memory circuits (RAM, EPROM) being connectable to a programming device for programming the processing unit and for providing a hard copy of the program stored in the processing unit,
   (c) a plug-in board frame equipped with a backplane connector bus and mechanical aids for plugging in the one or more control elements and the one or more processing units respectively, in such a way that the control elements and the processing units after being plugged into the frame are electrically connected in parallel without requiring additional wiring,
   (d) the function of the push-buttons and the signal light means being determined by the programming of the microporcessor and being, for example, momentary contact, permanent contact, mutual interlock of several push buttons, steady signal, or blinking signal.

2. An electronic display and control unit according to claim 1, wherein the signal light means comprise light emitting diodes, electric bulbs, or the like being provided inside of the push buttons beneath a transparent cover, the cover being visible and operable from the front side of the control unit.

3. An electronic display and control unit according to claim 2, wherein the transparent covers of several control elements represent a M×N matrix display, M being the number of push buttons mounted on one control element and N being the number of control elements within one plug-in board frame.

4. An electronic display and control unit according to claim 3, whereby the connection between several plug-in board frames is provided by serial data transmission lines, specially twisted pair cable or coaxial cable, in order to achieve long distances between different plug-in board frames.

5. An electronic display and control unit according to claim 1, 2 or 3, whereby the plug-in boards of one plug-in frame are connectable to plug-in boards of another plug-in frame by means of bus cable connections.

6. An electronic display and control unit according to claim 1, wherein the control element further comprises interface means for receiving and transmitting signals from and to external devices to be controlled, such as air conditioning equipment, whereby the input and output signals are processable by the microprocessor based on a control program stored in the memory circuits of the microprocessor and the condition provided by the push buttons.

7. An electronic display and control unit according to claim 6, whereby the control element further comprises display means for displaying the status of input lines and controlling the status of output lines, the status being determined by electrical potentials of the lines with respect to a reference potential, means for generating time intervals comprising digital timers or analog timers and means for selecting the address of one control element by means of a front mounted thumbwheel or the like.

8. An electronic display and control unit according to claim 1, 2, 3, 6 or 7, whereby the control element comprises electronic circuits for providing blink pulse operation for the signal light means and for debouncing the electrical contacts of the push button.

9. An electronic display and control unit according to one of the claims 1, 2, 3, 6 or 7, whereby the processing unit comprises memory circuits for storing the actual working status of all push buttons' signal light means, input and output means, the storing taking place in a section of the memory circuits which is protected against power failure by means of a back-up battery, enabling the electronic display and control unit to resume normal operation after power return.

10. An electronic display and control unit according to one of the claims 1, 2, 3, 6 or 7, whereby the processing unit comprises microprocessor means dedicated to different tasks, e.g., a bit processor for logic control, and/or a word processor for more sophisticated control, and different types of memory, such as RAM memory for actual data and EPROM memory for operating system data and user dependent control algorithms data.

11. An electronic display and control unit according to claim 10, whereby the memory is located on its own plug-in board having the same physical dimension as the board carrying the control element, thus enabling fast memory exchange, especially during set-up tests.

12. An electronic display and control unit according to one of the claims 1, 2, 3, 6, 7 or 4, whereby the programming device which is connectable to the processor board or memory board during set-up of the system, containing means for editing, debugging and storing programs as well as means for providing a hardcopy of the program, as for example a printer.

* * * * *

UNITED STATES PATENT AND TRADEMARK OFFICE
CERTIFICATE OF CORRECTION

PATENT NO. : 4,454,596

DATED : June 12, 1984

INVENTOR(S) : Reinhold Wunsch et al

It is certified that error appears in the above-identified patent and that said Letters Patent is hereby corrected as shown below:

Front page, second column, after "Assistant Examiner - William G. Niessen", insert --Attorney, Agent, or Firm - Staas & Halsey--.

Column 1, lines 54-55, "element" should be on one line.

Column 3, line 9, "stroage" should be --storage--.

Column 4, line 36, after "shows", insert --in--.

Column 5, line 6, "wth" should be --with--.

Column 6, line 44, after "Furthermore", insert --,--;

line 47, "my" should be --by--.

Column 7, line 24, after "for example", insert --,--.

UNITED STATES PATENT AND TRADEMARK OFFICE
CERTIFICATE OF CORRECTION

PATENT NO. : 4,454,596

DATED : June 12, 1984

INVENTOR(S) : Reinhold Wunsch et al

It is certified that error appears in the above-identified patent and that said Letters Patent is hereby corrected as shown below:

Column 11, line 60, "variabile" should be --variable--.

Column 14, line 13, delete "and not 1E2".

Column 15, line 56, "," should be --;--;
line 64, "," should be --;--.

Column 16, line 18, "tweisted" shuld be --twisted--.

Signed and Sealed this

Thirtieth Day of October 1984

[SEAL]

Attest:

Attesting Officer

GERALD J. MOSSINGHOFF

Commissioner of Patents and Trademarks